US009191586B2

(12) United States Patent
Minlong

(10) Patent No.: US 9,191,586 B2
(45) Date of Patent: Nov. 17, 2015

(54) BUFFERED DIRECT INJECTION PIXEL FOR INFRARED DETECTOR ARRAYS

(71) Applicant: Sensors Unlimited, Inc., Princeton, NJ (US)

(72) Inventor: Lin Minlong, Plainsboro, NJ (US)

(73) Assignee: Sensors Unlimited, Inc., Princeton, NJ (US)

( * ) Notice: Subject to any disclaimer, the term of this patent is extended or adjusted under 35 U.S.C. 154(b) by 108 days.

(21) Appl. No.: 13/936,533

(22) Filed: Jul. 8, 2013

(65) Prior Publication Data

US 2015/0009337 A1 Jan. 8, 2015

(51) Int. Cl.
| | |
|---|---|
| H04N 5/33 | (2006.01) |
| H04N 5/374 | (2011.01) |
| H04N 5/357 | (2011.01) |
| H04N 5/3745 | (2011.01) |
| H01L 27/146 | (2006.01) |

(52) U.S. Cl.
CPC .............. *H04N 5/33* (2013.01); *H04N 5/357* (2013.01); *H04N 5/3745* (2013.01); *H04N 5/37452* (2013.01); *H01L 27/14609* (2013.01)

(58) Field of Classification Search
CPC .............................. H04N 5/332; H04N 5/374
USPC .......................................... 250/318; 348/166
See application file for complete search history.

(56) References Cited

U.S. PATENT DOCUMENTS

| | | | |
|---|---|---|---|
| 4,933,648 A | 6/1990 | Frogge | |
| 5,382,977 A | 1/1995 | Kozlowski et al. | |
| 5,488,415 A | 1/1996 | Uno | |
| 5,523,570 A | 6/1996 | Hairston | |
| 5,898,168 A | 4/1999 | Gowda et al. | |
| 6,384,413 B1 * | 5/2002 | Pain | 250/330 |
| 6,965,707 B1 | 11/2005 | Kozlowski | |
| 2004/0017494 A1 * | 1/2004 | Lu et al. | 348/294 |
| 2005/0007473 A1 * | 1/2005 | Theil et al. | 348/308 |
| 2006/0208762 A1 * | 9/2006 | Lee | 326/87 |
| 2010/0164594 A1 | 7/2010 | Fitzi | |
| 2012/0068745 A1 * | 3/2012 | Hsieh et al. | 327/157 |
| 2012/0261553 A1 | 10/2012 | Elkind et al. | |

FOREIGN PATENT DOCUMENTS

| | | |
|---|---|---|
| EP | 0553406 A1 | 8/1993 |
| EP | 0897214 A2 | 2/1999 |

OTHER PUBLICATIONS

Sackinger et al., A High-Swing, High-Impedance MOS Cascode Circuit, Feb. 1990, Journal of Solid-State Circuits, vol. 25, No. 1, pp. 289-298.*
European Search Report for Belgium Patent Application No. BE20140481, dated Mar. 19, 2015.

* cited by examiner

*Primary Examiner* — David Porta
*Assistant Examiner* — Abra Fein
(74) *Attorney, Agent, or Firm* — Locke Lord LLP; Scott D. Wofsy; Joshua L. Jones

(57) ABSTRACT

A buffered direct injection pixel is disclosed that includes a photodiode for receiving an input signal, a direct injection transistor associated with the photodiode, and a Sackinger current mirror coupled with the direct injection transistor, providing reduced size, low noise and low power, as compared to prior art buffered direct injection pixels.

19 Claims, 2 Drawing Sheets

BUFFERED DIRECT INJECTION PIXEL FOR INFRARED DETECTOR ARRAYS

BACKGROUND OF THE INVENTION

1. Field of the Invention

The subject invention relates to image sensor circuitry, and more particularly, to a buffered direct injection pixel circuit for an infra-red focal plane array, having the characteristics of reduced size, low noise and low power consumption.

2. Background of the Related Art

Infrared detector systems typically require sophisticated tracking algorithms to accommodate the large and often dynamic changes in background information that results from the relatively high contrast and solar content of the radiation. Detectors operating in the infrared (IR) spectral band, however, can attain the same or greater thermal sensitivity with reduced signal processing complexity. As a result, infrared detection and tracking can often be accomplished using smaller, more cost-effective sensors having IR focal plane arrays (FPAs).

Unfortunately, IR focal plane arrays and multiplexing readout circuits have design constraints that can severely limit system performance. In the readout portion of an FPA, for example, the input amplifier cell circuitry that couples each photo detector to the corresponding readout site must perform several functions that are difficult to incorporate simultaneously in the small amount of space or "real estate" that is typically available on a signal processing chip.

A detector/amplifier cell of an FPA should ideally include: a detector interface stage that provides low impedance at a uniform operating bias; a large charge handling integration capacitance; a stage for uniform suppression of the background if integration capacity is inadequate; low power pixel multiplexing and reset stages; and an output stage adequate to drive the bus line capacitance for subsequent multiplexing at video rates.

Prior art IR FPAs typically lack impedance buffering, which forces a variation in detector dark currents and an increase in fixed pattern noise (i.e., spatial noise remaining after application of conventional two-point non-uniformity correction). Fixed pattern noise creates a visible mask in the imagery that obscures low contrast, high frequency information, thus degrading the minimum resolvable temperature and compromising performance under adverse conditions. Moreover, prior art devices lack capability for reducing pixel pitch and increasing pixel density. If the pixel pitch and detector/amplifier cell real estate are reduced in prior art devices, the performance limitations are further aggravated. When pixel pitch continues to decrease, issues of power and noise are become even more formidable.

Given the current state-of-the-art and the limited chip area available, there is insufficient detector/amplifier cell real estate for a readout circuit with conventional architecture to integrate all of the most important features such as low input impedance, uniform detector bias, and satisfactory charge storage capacity. However, because small cells are necessary for FPAs with high pixel counts, integrated readout circuits with reasonable die sizes, and compact optics, all the important functions of the readout circuit must be integrated in as little cell real estate as possible. Thus, there is a need for a pixel readout circuit with improved architecture having characteristics that are better optimized for use in an IR FPA.

SUMMARY OF THE INVENTION

This subject invention is directed to a new and useful buffered direct injection (BDI) pixel for an infra-red (IR) focal plane array (FPA) sensor. The BDI pixel includes a photodiode for receiving an input signal, a direct injection transistor linked with the photodiode, and a low power Sackinger current mirror coupled with the direct injection transistor and including only two transistors. There are two different pixel configurations envisioned, each having a different polarity.

In one configuration, the direct injection transistor of the BDI pixel is a PMOS transistor, and the Sackinger current mirror includes a bias transistor connected to ground. Thus, one embodiment of the subject BDI pixel and it includes two PMOS transistors and one NMOS transistor.

In another configuration, the direct injection transistor of the BDI pixel is a NMOS transistor, and the Sackinger current mirror includes a bias transistor connected to a power supply. Thus, another embodiment of the subject BDI pixel includes one PMOS transistor and two NMOS transistors.

In both embodiments, the direct injection transistor is coupled to a pixel circuit through an integration capacitor. The pixel circuit has three transistors, including a row selection transistor, a source follower transistor and a reset transistor.

Thus, in both instances, the BDI pixel circuit of the subject invention includes a total of six transistors, resulting in a circuit architecture of reduced size, low noise and low power consumption, as compared to prior art direct injection pixel circuits.

These and other features of the BDI pixel of the subject invention will become more readily apparent from the following detailed description taken in conjunction with the appended drawings.

BRIEF DESCRIPTION OF THE DRAWINGS

So that those having ordinary skill in the art to which the present invention pertains will more readily understand how to make and use the buffered direct injection pixel circuit disclosed herein, aspects thereof will be described in detail hereinbelow with reference to the drawings, wherein.

DETAILED DESCRIPTION OF THE PREFERRED EMBODIMENTS

Figure 1:
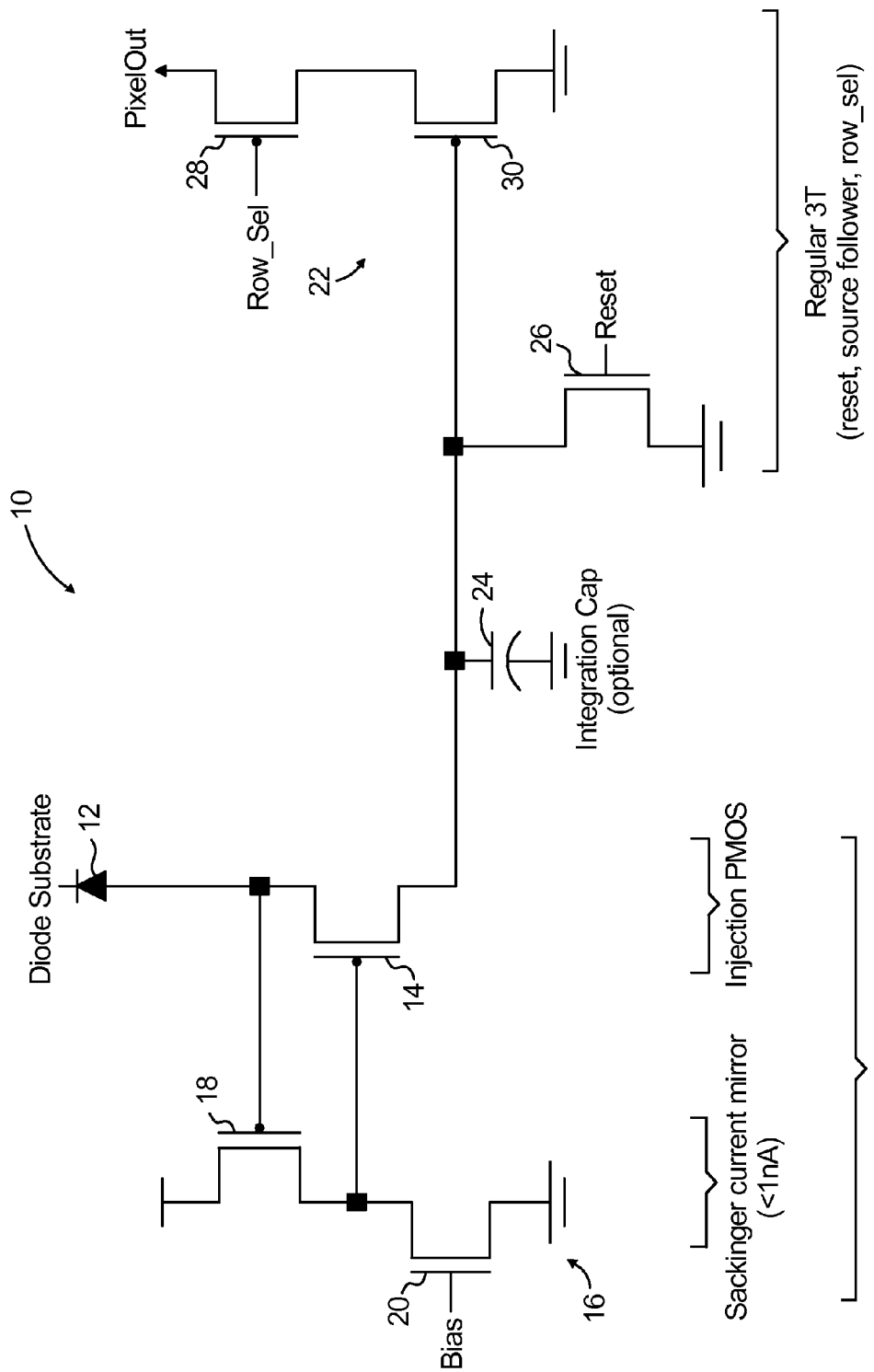
FIG. 1 is a schematic representation of an embodiment of the buffered direct injection pixel circuit of the subject invention, wherein the direct injection transistor is a PMOS transistor and the bias transistor of the Sackinger current mirror is connected to ground.
Figure 2:
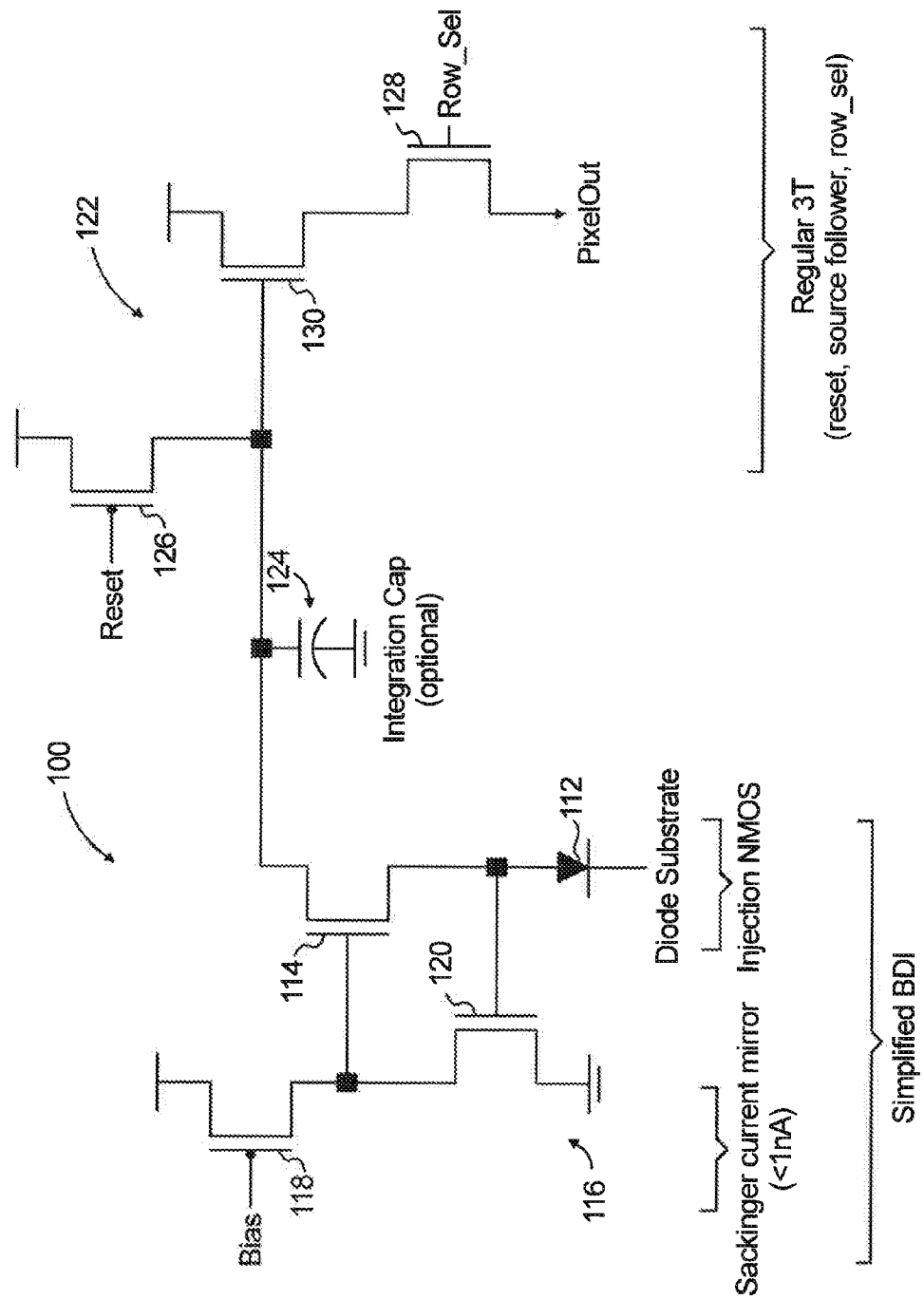
FIG. 2 is a schematic representation of another embodiment of the buffered direct injection pixel circuit of the subject invention, wherein the direct injection transistor is a NMOS transistor and the bias transistor of the Sackinger current mirror is connected to a power supply.

Referring now to the drawings wherein like reference numerals identify similar structural features or aspects of the subject invention, there is illustrated in FIGS. 1 and 2, novel embodiments of a buffered direct injection (BDI) pixel for an infra-red (IR) focal plane array (FPA) sensor.

Referring to FIG. 1, there is illustrated a buffered direct injection (BDI) pixel cell of the subject invention, which is designated generally by reference numeral 10. The BDI pixel cell 10 includes a photodiode 12 of any type or substrate for receiving an input signal, such as photons from a source of IR radiation.

The photodiode 12 converts the input signal into an electrical signal. A direct injection transistor 14 is linked to and reads the electrical signal from the photodiode 12. In this embodiment, the direct injection transistor is a p-type MOSFET otherwise referred to as a PMOS transistor.

The direct injection PMOS transistor 14 is coupled with a two-transistor Sackinger current mirror, designated generally by reference numeral 16. The two-transistor Sackinger current mirror 16 replaces a five-transistor full pixel amplifier, used in prior art pixel cells. Consequently, the Sackinger current mirror 16 consumes a very small amount of current, for example, less than about 1 nA of current, as compared to about 50 nA-100 nA of current consumption by a typical pixel amplifier.

It should be readily appreciated by those skilled in the art that a current mirror is designed to copy a current through one active device by controlling the current in another active device, keeping the output current constant regardless of loading. Conceptually, an ideal current mirror is simply an ideal inverting current amplifier that reverses the current direction.

The Sackinger current mirror 16 includes first and second transistors 18 and 20. The first transistor 18 is a PMOS transistor and it is connected to a power source. The second transistor 20 is a NMOS transistor, which serves as a bias transistor for the current mirror 16, and it is connected to ground. Thus, the BDI pixel 10 includes two PMOS transistors and one NMOS transistor.

With continuing reference to FIG. 1, the direct injection transistor 14 of BDI pixel cell 10 is coupled to a conventional pixel circuit 22 through an integration capacitor 24. The integration capacitor 24 functions to convert the input signal from the photo detector 12 into a voltage. Those skilled in the art will readily appreciate that the integration capacitor 24 is optional in this circuit architecture.

The pixel circuit 22 has three transistors, including a reset transistor 26, a row selection transistor 28, a source follower transistor 30, each of which are well known in the art. Those skilled in the art will readily appreciate that the pixel circuit 22 can take the form of any other well known pixel readout circuit architecture. Moreover, the scope of the subject invention should not be unduly limited by the illustrated architecture of pixel circuit 22.

Referring to FIG. 2, there is illustrated another buffered direct injection (BDI) pixel cell of the subject invention, which is designated generally by reference numeral 100. The BDI pixel cell 100 includes a photodiode 112 of any type or substrate for receiving an input signal. The photodiode 112 converts the input signal into an electrical signal.

A direct injection transistor 114 is linked to and reads the electrical signal from the photodiode 112. In this embodiment, the direct injection transistor is a n-type MOSFET otherwise referred to as a NMOS transistor.

The direct injection NMOS transistor 114 is coupled with a two-transistor Sackinger current mirror, designated generally by reference numeral 116. The Sackinger current mirror 116 is of a different polarity than the Sackinger current mirror 16 of FIG. 1. Therefore, the first transistor 118 of Sackinger current mirror 116 is a NMOS transistor which serves as a bias transistor and it is connected to a power source. The second transistor 120 is a PMOS transistor that is connected to ground. Thus, the BDI pixel cell 100 includes one PMOS transistor and two NMOS transistors.

With continuing reference to FIG. 2, the direct injection transistor 114 of BDI pixel cell 100 is coupled to a conventional pixel circuit 122 through an integration capacitor 124. The pixel circuit 122 has three transistors, including a reset transistor 126, a row selection transistor 128 and a source follower transistor 30, each of which are well known in the art. Those skilled in the art will readily appreciate that the pixel circuit 122 can take the form of any other well known pixel readout circuit architecture. Moreover, the scope of the subject invention should not be unduly limited by the illustrated architecture of pixel circuit 122.

In both embodiments of the subject invention, the BDI pixel circuit of the subject invention includes a total of six transistors, resulting in a circuit architecture of reduced size covering less "real estate", as compared to prior art direct injection pixel circuits having a five transistor pixel amplifier.

Furthermore, the BDI pixel cell of the subject invention consumes less than 1% of the power consumed by a pixel cell constructed with a conventional five transistor pixel amplifier. So a much larger pixel array can be constructed using the BDI pixels of the subject invention. There is also lower noise generated by the BDI pixels of the subject invention, as compared to conventional BDI pixel.

More particularly, with smaller pixel pitch, signal irradiance per pixel inevitably decreases and signal-to-noise ratio decreases accordingly. Indeed, fewer transistor count and low bias current in this embodiment contribute to lower noise than the readout design in the prior art.

In addition, the Sackinger current mirror provides much less variation in photodiode reverse-bias by its intrinsic negative feedback. This is similar to a typical direct injection six-transistor pixel amplifier, but with much less real-estate, power and noise.

Although the subject invention has been described with respect to preferred embodiments, those skilled in the art will readily appreciate that changes and modifications may be made thereto without departing from the spirit and scope of the subject invention as defined by the appended claims

What is claimed is:

1. A buffered direct injection pixel comprising: a current mirror coupled with a direct injection transistor, wherein the current mirror is a Sackinger current mirror that consumes less than about 1 nA of current.

2. A buffered direct injection pixel as recited in claim 1, further comprising a photodiode associated with the direct injection transistor for receiving an input signal to the pixel.

3. A buffered direct injection pixel as recited in claim 1, wherein the direct injection transistor is a PMOS transistor.

4. A buffered direct injection pixel as recited in claim 3, wherein the current mirror includes a bias transistor connected to ground.

5. A buffered direct injection pixel as recited in claim 1, wherein the direct injection transistor is a NMOS transistor.

6. A buffered direct injection pixel as recited in claim 5, wherein the current mirror includes a bias transistor connected to a power supply.

7. A buffered direct injection pixel as recited in claim 1, wherein the direct injection transistor is coupled to a pixel circuit.

8. A buffered direct injection pixel as recited in claim 7, wherein the direct injection transistor and the pixel circuit are coupled through an integration capacitor.

9. A buffered direct injection pixel as recited in claim 8, wherein the pixel circuit includes a row selection transistor.

10. A buffered direct injection pixel as recited in claim 9, wherein the pixel circuit further includes a source follower transistor.

11. A buffered direct injection pixel as recited in claim 10, wherein the pixel circuit further includes a reset transistor.

12. A buffered direct injection pixel comprising:
a) a photodiode for receiving an input signal;
b) a direct injection transistor linked with the photodiode; and c) a Sackinger current mirror that consumes less about 1 nA of current coupled with the direct injection transistor.

13. A buffered direct injection pixel as recited in claim 12, wherein the direct injection transistor is a PMOS transistor.

14. A buffered direct injection pixel as recited in claim 13, wherein the Sackinger current mirror includes a bias transistor connected to ground.

15. A buffered direct injection pixel as recited in claim 12, wherein the direct injection transistor is a NMOS transistor.

16. A buffered direct injection pixel as recited in claim 15, wherein the Sackinger current mirror includes a bias transistor connected to a power source.

17. A buffered direct injection pixel as recited in claim 12, wherein the direct injection transistor is coupled to a pixel circuit.

18. A buffered direct injection pixel as recited in claim 17, wherein the direct injection transistor is coupled to the pixel circuit through an integration capacitor.

19. A buffered direct injection pixel as recited in claim 18, wherein the pixel circuit includes a row selection transistor, a source follower transistor and a reset transistor.

\* \* \* \* \*